United States Patent [19]

Gaboury et al.

[11] Patent Number: 5,498,865
[45] Date of Patent: Mar. 12, 1996

[54] PHOTODIODE AMPLIFIER CIRCUIT WITH IMPROVED SENSITIVITY TO HIGH EFFICIENCY ILLUMINATION

[75] Inventors: Michael J. Gaboury, Burnsville, Minn.; Todd A. Jackson, Pittsford, N.Y.

[73] Assignee: Eastman Kodak Company, Rochester, N.Y.

[21] Appl. No.: 357,817

[22] Filed: Dec. 16, 1994

[51] Int. Cl.$^6$ ............................................. H01J 40/14
[52] U.S. Cl. ........................ 250/214 A; 250/214 LA; 250/214 LS; 330/59
[58] Field of Search ................. 250/214 A, 214 LS, 250/214 L; 330/59, 308; 327/514, 561, 563

[56] References Cited

U.S. PATENT DOCUMENTS

| | | |
|---|---|---|
| 4,045,731 | 8/1977 | Tokunou et al. . |
| 4,220,412 | 9/1980 | Shroyer et al. . |
| 4,540,946 | 9/1985 | Sainz et al. . |
| 4,805,236 | 2/1989 | Urala . |
| 4,827,119 | 5/1989 | Gaboury . |
| 5,012,202 | 4/1991 | Taylor . |
| 5,037,198 | 8/1991 | Gaboury . |
| 5,087,892 | 2/1992 | Hayashi . |
| 5,103,084 | 4/1992 | Williams et al. . |
| 5,345,073 | 9/1994 | Chang et al. ............... 250/214 A |

*Primary Examiner*—Edward P. Westin
*Assistant Examiner*—Jacqueline M. Steady
*Attorney, Agent, or Firm*—David M. Woods

[57] ABSTRACT

A photodiode amplifier includes an input stage having a first pair of transistors connected as a differential pair to have a low input impedance and a current source connected into the input stage to bias the pair of transistors. A photodiode is connected into the input stage across the transistors so as to provide differential effect to current flowing through the transistors. By means of such connection, the photodiode is presented with low input impedance, its time constant is accordingly lowered, and the system response of the photodiode amplifier is extended into higher frequencies. The photodiode amplifier is of particular use in an illuminant discriminator capable of distinguishing a range of separate illuminants, including high efficiency fluorescent lighting within the passband of the photodiode amplifier.

12 Claims, 4 Drawing Sheets

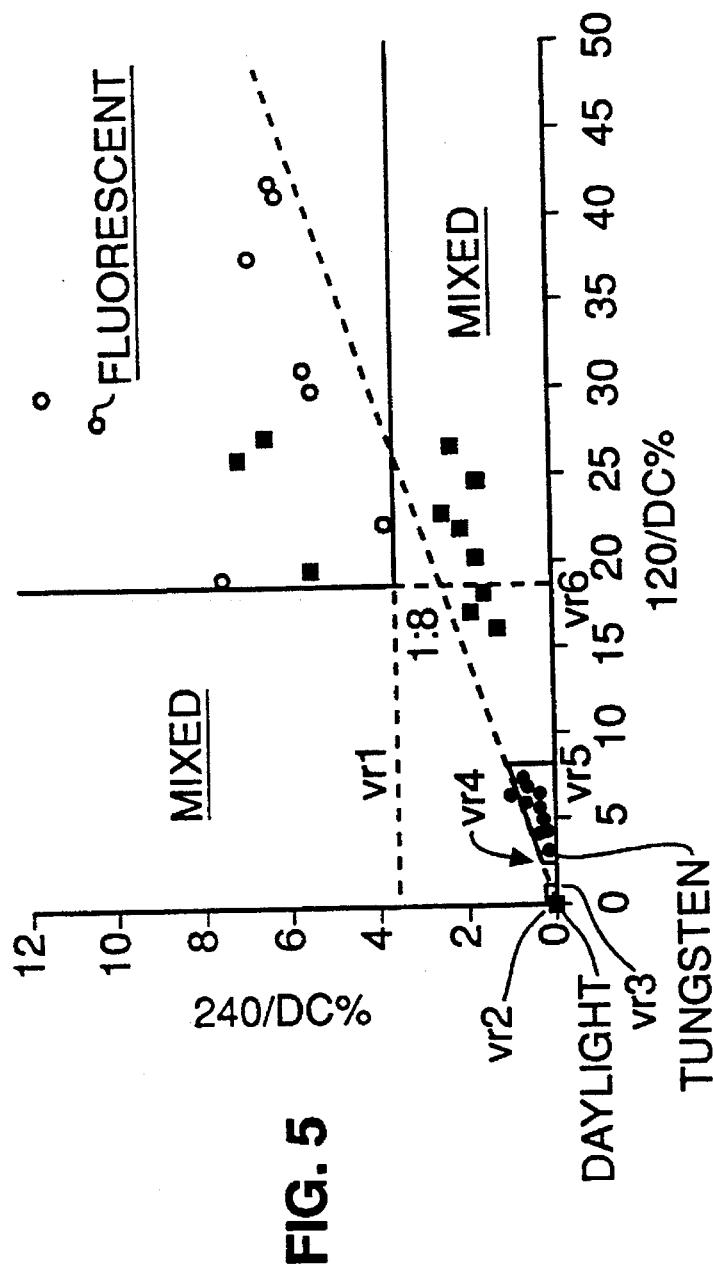
FIG. 5
FIG. 6A
FIG. 6B
FIG. 6C

PHOTODIODE AMPLIFIER CIRCUIT WITH IMPROVED SENSITIVITY TO HIGH EFFICIENCY ILLUMINATION

FIELD OF THE INVENTION

The present invention relates to the field of photodiode amplification and more particularly to the use of photodiode amplification in the detection of broadband signals. A particular application is its use in discriminating among various types of light sources, such as fluorescent light, incandescent light, high efficiency lighting, and natural daylight.

BACKGROUND OF THE INVENTION

A currently used photodiode amplifier is shown in FIG. 1. A photodiode 10 is connected across the input terminals of an amplifier 11 between a voltage reference 12 and a feedback resistor 13. The frequency response of such a circuit is determined by the resistance $R_F$ of the feedback resistor 13 and the capacitance C of the photodiode 10. The bandwidth of the amplifer 11 will be the gain-bandwidth product divided by the gain. Consequently, at high gains the bandwidth is small. More specifically, because the open loop gain of the amplifier 11 will be diminished at high frequencies, the effective impedance seen by the photodiode 10 will be large. Thus, the circuit performs with a low pass characteristic, having a cutoff frequency $f_c$=$1/2\pi R_I C$, where $R_I$ is the effective input impedance of the circuit. Unfortunately, the choices for $R_F$ and C are not optimal in relation to broadband usage, since the photodiode 10 must be large (which generates a large capacitance C) in order to obtain sufficient light sensitivity while the amplifier 11 requires a large feedback impedance (resistance $R_F$ of the feedback resistor 13) in order to obtain sufficient transimpedance gain. Reducing either value defeats the purpose of the circuit. As a result, the cutoff frequency fc is ordinarily close to DC values, and high frequency waveforms are not output by the amplifier 11. This becomes a particular problem in photographic applications where the output of the photodiode amplifier is intended for use in discriminating the type of illuminant.

To produce faithful photographic reproductions of multi-colored scenes, the color balance of the photographic film must be compatible with the spectral characteristics of the scene illuminant. Many photographic color emulsions are color balanced for use with natural daylight and others are color balanced for use with incandescent illumination. To properly expose a color film with an illuminant for which the film is not color balanced it is necessary to use color compensating filters. Alternatively, correction can be made during the printing stage. When such compensation is automatically provided by the camera, by engaging the proper filter or by marking the film with a printing instruction, it is necessary to have some automatic technique for discriminating among various types of light sources.

A patent of interest for its teaching of a method and apparatus for discriminating illuminant light is U.S. Pat. No. 4,220,412, entitled "Illuminant Discrimination Apparatus and Method" by R. A. Shroyer, et al. The method and apparatus disclosed in that patent utilizes the peak amplitude and the harmonic distortion in the sine wave signal that is derived from the illuminant source impinging on a photodiode. In particular, the flicker ratio, which is the ratio of the brightest to the dimmest intensities of the light during a given time interval, is detected. Natural light, like other light emanating from a source of constant brightness, has a flicker ratio of unity. Artificial light sources, being energized by ordinary household line voltage, have a brightness which flickers at approximately 120 Hz, twice the frequency of the line voltage. Owing to the different rates at which the energy-responsive elements of incandescent and fluorescent lamps respond to applied energy, such illuminance can be readily distinguished by their respective flicker ratio. Using the harmonic content, it is further possible to distinguish incandescent light from fluorescent light mixed with daylight and to detect which light source is predominant in a mixture of fluorescent and incandescent light.

With the general interest in digital systems, it is useful to incorporate illuminant discrimination into a digital environment. This is done in U.S. Pat. No. 4,827,119, which discriminates among various types of illuminants such as fluorescent light, tungsten light and natural daylight. The apparatus utilizes an analog-to-digital converter and a microprocessor to perform a Fourier series analysis on one or more of the harmonics of the digitized illuminant signal. The microprocessor compares the amplitudes of the harmonics against the amplitudes of known illuminant sources to identify the source.

In certain situations it is desirable to separate scenes having a dominant illuminant from scenes having mixed illumination with no single dominant illuminant. In such cases, color correction is best handled by printing algorithms. In U.S. Pat. No. 5,037,198, mixed illuminant detection is obtained by using boundary conditions in order to eliminate detection errors seen when fluorescent illumination mixes with certain quantities of daylight and otherwise causes a tungsten reading. The electrical signals derived from the illuminant are processed in a log amplifier to form a signal approximately equal to the log of the DC term plus a ratio of the dominant AC components to the DC components. The signals output from the log amplifier are converted into two filtered outputs which are multiples of the frequency of expected artificial illumination sources. Each of the output signals is compared against a plurality of threshold signals to identify which illuminant components are present, and to identify mixed sources.

The methods employed in U.S. Pat. Nos. 4,827,119 and 5,037,198 examine the frequency of flicker in the light intensity spectrum and determine from the frequency harmonics which type of illumination is being used. A problem has arisen because new fluorescent lighting systems use power inverters to increase the frequency of operation and the efficiency of the light sources. With such high efficiency fluorescent illumination, it is difficult to detect these higher frequencies, which are as high as 70 kHz, due to speed limitations in the circuit topologies typically used in amplification of the signal generated by the photodiode detector.

SUMMARY OF THE INVENTION

The present invention is directed to overcoming one or more of the problems set forth above. Briefly summarized, according to one aspect of the present invention, a photodiode amplifier comprises an input stage including a photodiode, and an amplifier stage connected to the output of the input stage. The input stage includes a first pair of transistors connected as a differential pair to have a low input impedance and a current source connected into the input stage to bias the transistors. The photodiode is connected into the input stage so as to have a differential effect upon current flowing through the transistors.

The advantage of the invention is that a photodiode amplifier for camera photometer applications capable of detecting known flicker frequencies can additionally detect new high efficiency lighting. This is accomplished by lowering the impedance seen by the photodiode, thereby lowering the time constant of the photodiode and accordingly extending the system frequency response into the high efficiency region. This is specifically done by connecting the photodiode such that the impedance presented to the photodiode is proportional as the reciprocal of the transconductance of the transistors.

These and other aspects, objects, features and advantages of the present invention will be more clearly understood and appreciated from a review of the following detailed description of the preferred embodiments and appended claims, and by reference to the accompanying drawings.

BRIEF DESCRIPTION OF THE DRAWINGS

The prior art and the invention will be described in relation to the drawings, in which

FIG. 5 is a chart illustrating the performance characteristics of the discriminator of FIG. 3; and FIGS. 6A, 6B, 6C illustrate in logic circuit form one set of combinational logic that may be used with the discriminator of FIG. 3.

DETAILED DESCRIPTION OF THE INVENTION

Figure 1:
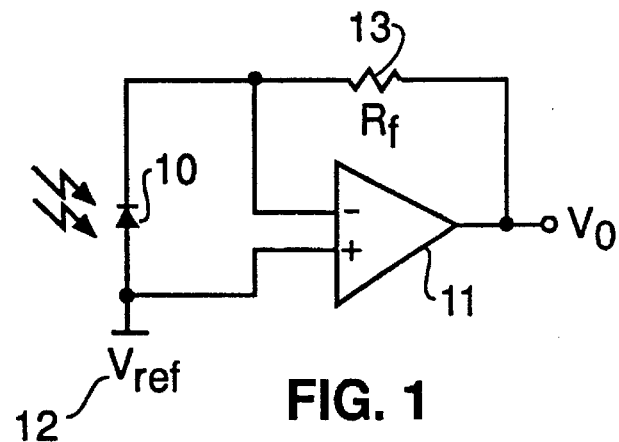
FIG. 1 shows a circuit of a known photodiode amplifier.
Figure 2:
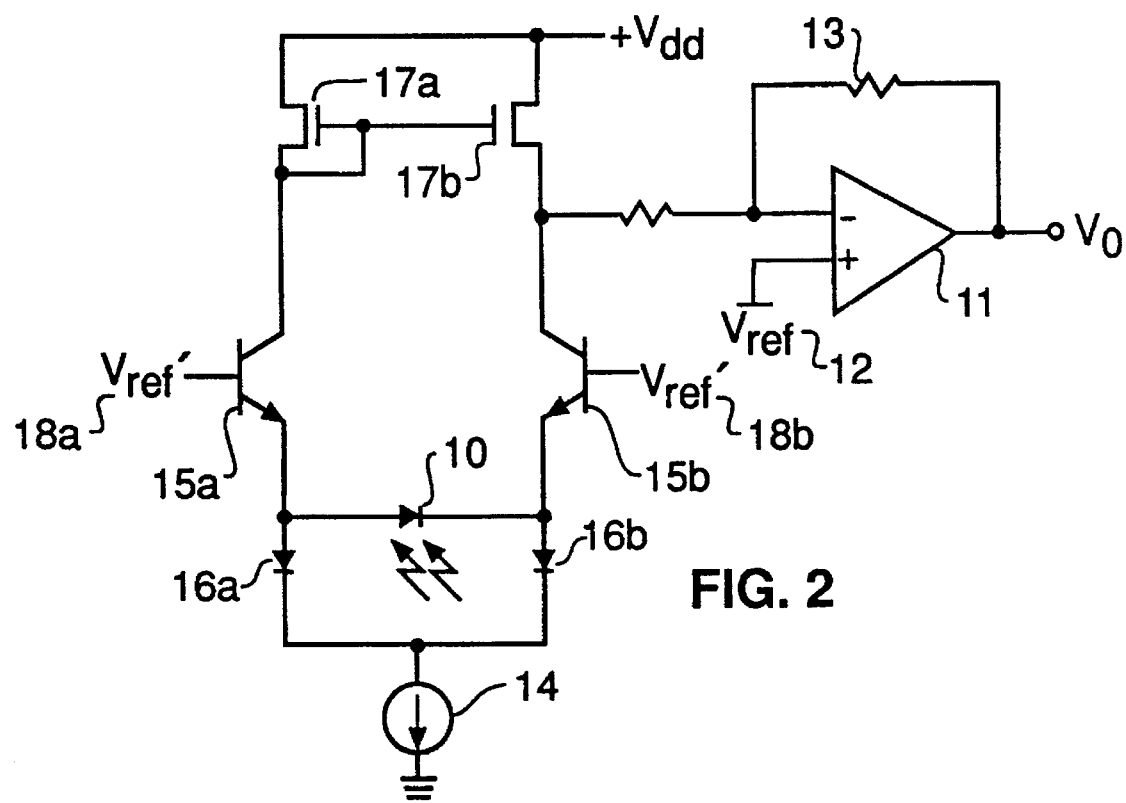
FIG. 2 shows a photodiode connected into the input stage of a photodiode amplifier according to the invention.

A new circuit topology for controlling the impedance presented to a photodiode is shown in FIG. 2. Instead of connecting the photodiode 10 directly across the input terminals of the amplifier 11, as shown in FIG. 1, the photodiode 10 is connected into an input stage 18 having a differential pair of transistors 15a and 15b and a high impedance current source 14 connected into the input stage so as to bias the transistors 15a and 15b. The transistors 15a and 15b are arranged in common base configuration such that the photodiode 10 is connected between the emitters thereof to have a differential effect upon current flowing through the transistors 15a and 15b. The common base configuration provides a low input impedance for the photodiode 10. A pair of diodes 16a and 16b are connected into the input stage 18 so as to clamp the voltage across the photodiode 10 substantially to zero potential and thereby set the operating region for the photodiode 10. The emitters of transistors 15a and 15b are connected through the diodes 16a and 16b to the current source 14, and the collectors thereof are connected to a pair of field effect transistors 17a and 17b forming an active collector load for the respective transistors 15a and 15b. Respective voltage references 18a and 18b ($V_{ref}$) are derived from a conventional low impedance source and applied to the bases of the transistors 15a and 15b. An output is taken from the collector of the transistor 15b and applied to the negative input of the differential amplifier 11. (While a single-ended output is shown, a double-ended output may be used. In that case, outputs would be taken from the collectors of both transistors 15a and 15b and applied to both inputs of the amplifier 11.)

The circuit topology shown in FIG. 2 is based on translinear circuit techniques, and makes possible the detection of high frequency waveforms. In this translinear circuit, the impedance seen by the photodiode 10 is reduced to the reciprocal of the transconductance of the transistors 15a and 15b, which is inversely proportional to the current value I provided by the current source 14. Thus at high values of current I, the impedance seen by the photodiode 10 in the circuit of FIG. 2 is 2–3 orders of magnitude lower than that seen by the photodiode in the known configuration (FIG. 1). Since the dominant pole of the low pass system response of the circuit shown in FIG. 2 is determined by its time constant (RC), i.e., the product of the capacitance of the photodiode 10 and the impedance that it sees, the speed of the system response is also increased by 2–3 orders of magnitude. Consequently the low pass cutoff frequency of the system response is extended well beyond the DC components to include high frequency waveforms.

The translinear circuit of FIG. 2 is useful in a variety of photodiode applications where an extended detection bandwidth is desirable. Such applications include communications systems utilizing, for example, fiber optic light transmission or the detection of modulated laser beams. An interesting application is in the detection of flicker waveforms for the purpose of discriminating the type of illuminant (sun, tungsten, fluorescent, etc.). In that application, the cutoff frequency of the system response needs to be high enough to include the flicker waveforms of high efficiency lighting.

Figure 3:
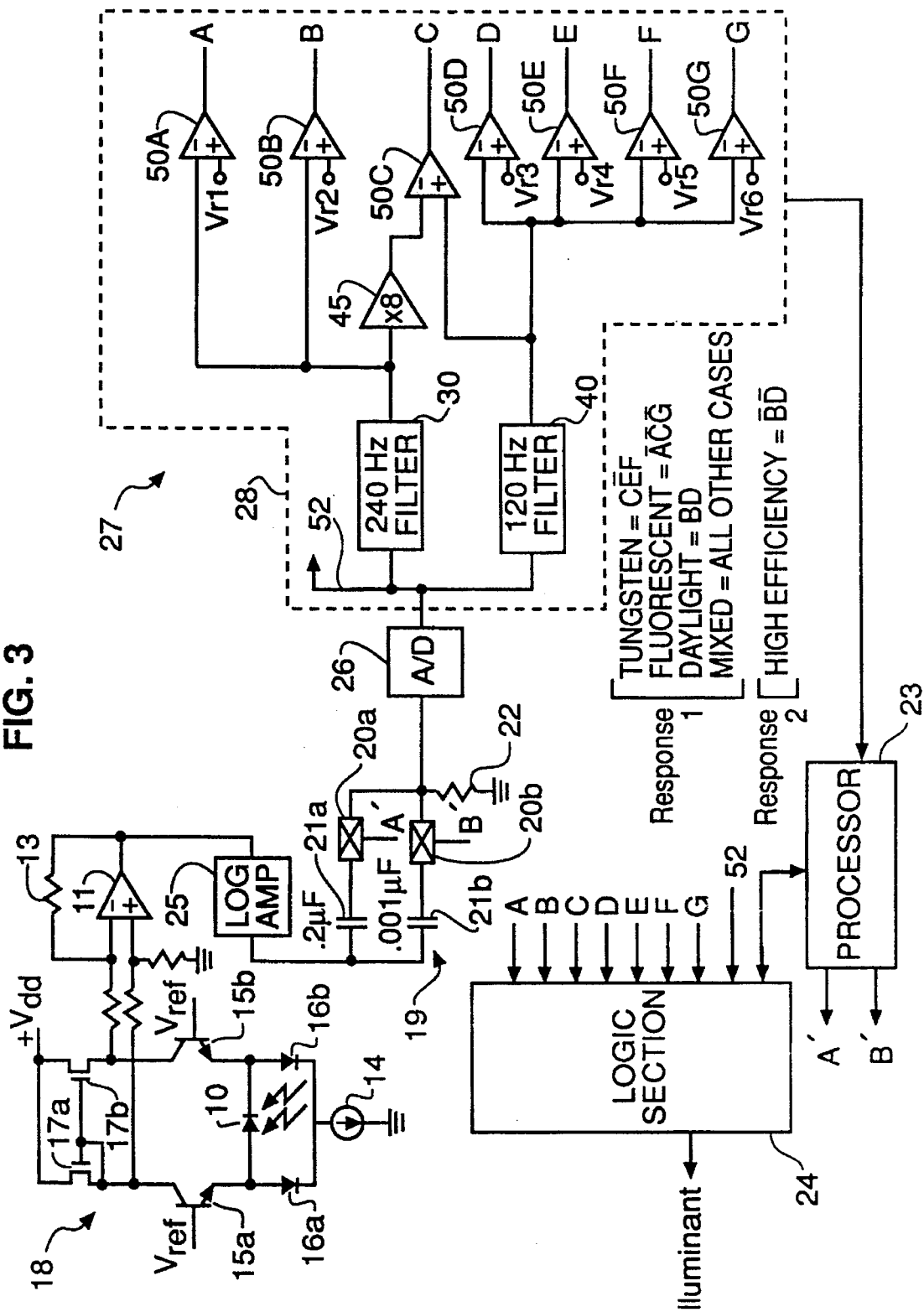
FIG. 3 illustrates in block diagram an illuminant discriminator employing an implementation of the present invention.

Referring to FIG. 3, the translinear circuit of FIG. 2 is included in an illuminant discriminator circuit for the detection of high efficiency lighting, which includes high frequency components (70 kHz).

Illuminant light is detected with the photodiode 10 to provide an electrical signal which is a function of the spectral content of the illuminant light. The photodiode 10 responds to incident light by producing a voltage that is logarithmically related to the intensity of light impinging thereon. When the light is from a fluorescent or incandescent lamp driven by a line voltage operating at a predetermined frequency, the photodiode produces a voltage having a DC component (or average value) proportional to the average light intensity and an AC component having a fundamental frequency that is proportional to twice the frequency of the line voltage (i.e., twice a conventional household line frequency of 60 Hz, for a fundamental of 120 Hz). In addition, as explained in U.S. Pat. No. 4,220,412 (which is incorporated herein by reference), the brightness curve of the fluorescent source contains more harmonic distortion (i.e., distortion due to the presence of harmonic frequency components other than the fundamental) than does the incandescent source. Moreover, the photodiode 10, when implemented in the circuit according to the invention, will produce high frequency components when exposed to high efficiency light sources.

The signal from the photodiode 10 is processed by the translinear input stage 18 (as described in connection with FIG. 2), the amplifier 11, a logarithmic amplifier 25, and a switched high pass filter 19. The switching portion of the high pass filter 19 includes analog switches 20a and 20b connected to switching lines A' and B', respectively, to connect either capacitor 21a or capacitor 21b into the high pass circuit. The resistor 22 completes the high pass configuration.

Figure 4:
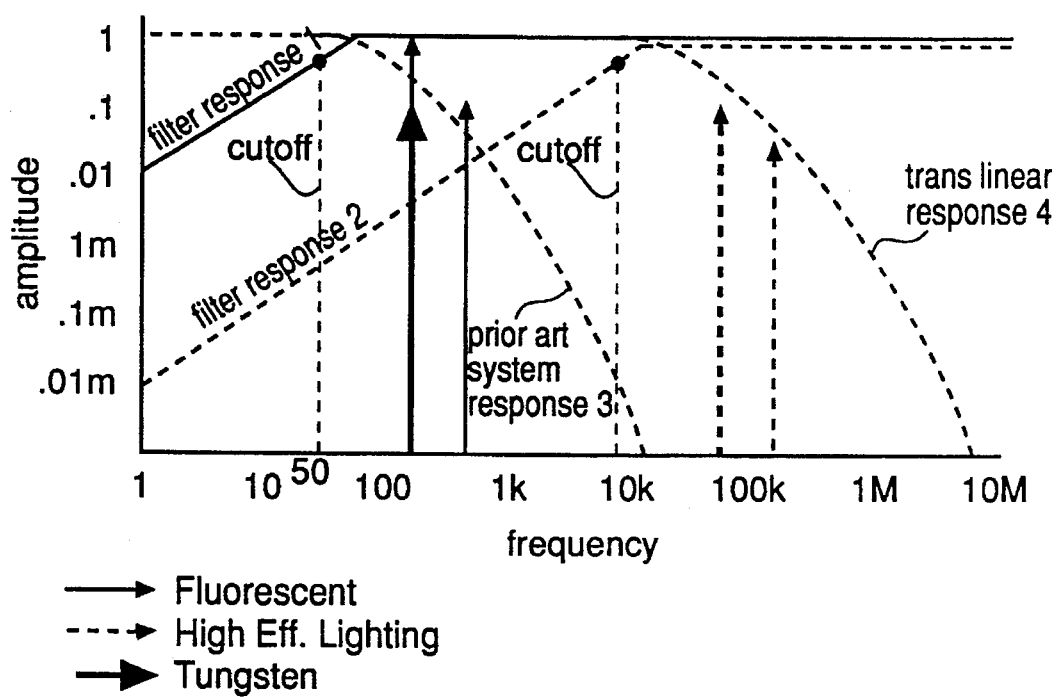
FIG. 4 is a frequency spectrum diagram of various light sources showing the system response and the cut-off characteristics of filters used with the preferred apparatus implementation of FIG. 1.

FIG. 4 shows the frequency response envelopes, designated as filter response 1 and filter response 2, of the switched high pass filter 19 relative to the normalized filter frequency spectrum for different light types, including tungsten, fluorescent, and high efficiency lighting. In the illustrated embodiment, for a suitable resistance 22, these envelopes are obtained by selecting appropriate capacitor values (e.g., a 0.2 µf capacitor and a 0.001 µf capacitor for capacitors 20a and 20b, respectively). It is also noteworthy that a conventional system response, as provided by the known photodiode amplifier of FIG. 1, would have a cutoff characteristic represented by the prior art system response 3 shown in FIG. 4. Thus, in the known system, an illuminant discriminator would not pass the high efficiency waveforms. With the translinear input stage 18, however, the system response is extended to include high efficiency lighting (see the translinear response 4). Switching lines A' and B' are activated by a processor 23 in response to an indication from a logic section 24, which includes the logic circuits shown in FIGS. 6A, 6B, and 6C. By activating analog switch 20a to select capacitor 21a, the filter response 1 is obtained with a cutoff frequency (at 3 dB down) of about 50 Hz; by activating analog switch 20b to select capacitor 21b, the filter response 2 is obtained with a cutoff frequency (at 3 dB down) of about 10 kHz. With such cutoff frequencies, filter response 1 includes all lighting components and filter response 2 effectively eliminates fluorescent and tungsten lighting.

Consequently, all waveform components, including high efficiency components, are obtained with the analog switch 20a set to include capacitor 21a in the switched high pass filter 19; that is, filter response 1 (FIG. 4) is obtained. Only high efficiency waveform components are obtained when the analog switch 20b is set to include capacitor 21b in the switched high pass filter 19; that is, filter response 2 is obtained. High efficiency illumination is accordingly isolated.

While the circuit of FIG. 3 may be operated in a number of ways to discriminate different illuminants, it is advantageous to initially perform three tests as shown in the following table:

| | TEST OUTCOME | ILLUMINANT CATEGORY |
| --- | --- | --- |
| TEST #1 | output with filter response 1 same as output with filter response 2. Both responses non-zero. | only high efficiency illuminant |
| TEST #2 | Output with filter response 1 is not the same as output with filter response #2. Both responses non-zero. | mix of high efficiency and conventional illuminants |
| TEST #3 | Output with filter response 2 is zero, output with filter response 1 is non-zero. | conventional illuminant only |

In initial operation, the test is performed by sequentially triggering switching lines A' and B' and taking a reading of the output of both filter responses 1 and 2. The signals are provided directly to the logic section 24 on a line 52 and compared to each other. If the signal levels are the same then only high efficiency lighting components are present in the frequency spectrum represented by FIG. 4 (since the filter response 2 would have effectively eliminated all other frequency components). If signals are present in both responses but the levels are different (test #2), then there is a mixture of high efficiency lighting and "conventional" (daylight, tungsten, fluorescent) lighting. In this situation, it is usually best to leave color adjustments to the printing process. If an output is only present for filter response 1 (test #3), then the lighting is "conventional" and the boundary conditions represented in FIG. 3 are used by the logic section 24 to distinguish the type of lighting.

More particularly, in order to analyze "conventional" illuminants (test #3), the output signal from the amplifier 11 is compressed by the logarithmic amplifier 25. (In place of the logarithmic amplifier 25, a log output could be taken from the amplifier 11 by substituting a transistor for the feedback resistor 13.) The output signal from logarithmic amplifier 25, given the relative amplitudes of the various frequency components of the input signal as subsequently processed by the switched high pass filter 19, is approximately equal to a log of the DC term plus a ratio of the dominant AC components to the DC components. Several AC:DC ratios are present at the output of the log amp 25, in particular a fundamental AC/DC ratio and a second harmonic AC/DC ratio. As explained in U.S. Pat. No. 5,037,198, which is incorporated herein by reference, the output of the log amp 25 is a discriminator signal having a collection of harmonic components that can be mapped into the coordinate system shown in FIG. 5, which shows the performance of the system for low frequency incandescent and fluorescent lighting in terms of AC/DC amplitude ratios. The amplitude of each harmonic component, as explained in the '198 patent, is a measure of the type of illumination present.

An A/D converter 26 digitizes the high passed discriminator signal from the output of the switched high pass filter 19. The digitized signal is then directed to a microprocessor 27, which is programmed as a digital filter to perform the filtering and comparing operations shown within the broken line 28. In doing the digital filtering, the microprocessor 27 determines from evenly spaced samples the fundamental frequency and the second harmonic (for low frequency sources). The amplitudes of each frequency are determined by the square root of the squares of the sine and cosine terms. As described in the aforementioned U.S. Pat. No. 4,827,119, which is incorporated herein by reference, it is convenient to determine the fundamental frequency and the second harmonic from 8 samples spaced 1.042 ms. apart, assuming 60 Hz line frequency. Clearly, such a sampling frequency is far too low to reproduce a high efficiency lighting waveform. However, the sampling rate appropriate for tungsten and conventional fluorescent lighting produces enough samples within the frequency spectrum represented by FIG. 2 to provide the basis for distinguishing high efficiency lighting from other lighting. As was described earlier, this is done from the line 52 by comparing the outputs of the two filter responses.

The digitized discriminator signal is filtered by a 240 Hz digital filter 30 and a 120 Hz digital filter 40. The outputs of the filters 30 and 40 thus correspond to the coordinates in FIG. 5. The filter outputs are processed by comparator stages 50A–50G. Each of the comparator stages receives a threshold reference Vr1–Vr6. The reference values assigned to Vr1–Vr6 are determined from the chart of FIG. 5. The stage 50C receives the output signals from both filters 30 and 40 with the output from the 240 Hz filter 30 being boosted in gain by a factor of 8 in a gain stage 45. The comparator stages 50A and 50B form a first comparing means. A second comparing means is formed by comparator stages 50D through 50G, and comparator stage 50C along with gain stage 45 form a third comparing means. Although various types of logic functions can be used to form the desired outputs from the outputs A–G, the preferred logic is illustrated in FIGS. 6A–C. As can be seen in FIGS. 6A–6C, daylight requires both a B and a D input. Tungsten requires a C and an F input but not E, and fluorescent takes not A, not C, and not G.

FIG. 5 illustrates, for filter response 1, the data taken from several light sources plotted such that the 120 Hz/DC ratio is the ordinate axis and the 240 Hz/DC ratio is the vertical axis. The boundary regions for mixed, fluorescent, daylight and tungsten illumination are also illustrated in FIG. 5. The daylight region (area) is defined by the voltage values Vr2 and Vr3 which exists around the (0,0) region. The tungsten region is defined by Vr4, Vr5 and a dotted gain line. The mixed regions are set off by Vr1, Vr6 and the dotted gain line. In the mixed regions there are additional data, where there is no predominant illuminant category present. A diagonal boundary condition, which is formed by the X8 diagonal gain line of amplifier 45, further defines the mixed region, particularly relative to tungsten light. Moreover, there is a lower limit on the ratio 240 Hz:120 Hz. For the purposes of an easy implementation, the slope of 1:8 was chosen since it results in a low percentage of tungsten falling into the mixed region; however, this ratio may be a little smaller for optimum discrimination. Although there are no line harmonics present in daylight lit scenes, there is a possibility of dominantly daylight lit scenes so a region close to the origin has been set aside as daylight.

This technique does not limit itself to one particular method of implementation. The block diagram of FIG. 3 illustrates the preferred embodiment, implemented with comparator stages in a digital system. Such a digital implementation is shown in the aforementioned U.S. Pat. No. 4,827,119, which is incorporated herein by reference. Frequency components listed are those seen in regions where 60 Hz power grids are used but they can be extended by replacing 120 Hz with the 2nd harmonic of the line frequency and 240 Hz with the 4th harmonic, etc. Moreover, the separate filter responses could be achieved by using two separate high pass filters, although it is desirable from the standpoints of circuit size and cost to devise a single circuit as shown in FIG. 3 which can be configured to alter the frequency response.

While there has been shown what is considered to be the preferred embodiment of the present invention, it will be manifest that many changes and modifications may be made therein without departing from the essential spirit of the invention. It is intended therefore, in the annexed claims to cover all such changes and modifications as may fall within the true scope of the invention. For instance, while the transistors 15a and 15b in the input stage 18 have been shown as bipolar transistors, they may alternatively be field effect transistors connected in a common gate configuration.

| PARTS LIST | |
| --- | --- |
| 10 | photodiode |
| 11 | amplifier |
| 12 | voltage reference |
| 13 | feedback resistor |
| 14 | current source |
| 15a, 15b | transistors |
| 16a, 16b | diodes |
| 17a, 17b | field effect transistors |
| 18 | translinear circuit |
| 19 | high pass filter |
| 20a, 20b | analog switches |
| 21a, 21b | capacitors |
| 22 | resistor |
| 23 | processor |
| 24 | logic section |
| 25 | log amp |
| 26 | A/D |
| 27 | microprocessor |
| 30 | 240 Hz filter |
| 40 | 120 Hz filter |
| 45 | gain stage |
| 50A–50G | comparator stages |

What is claimed is:

1. An illuminant discriminator comprising:

a photodiode amplifier for converting an impinging illuminant into an analog signal, said photodiode amplifier comprising (a) an input stage including a first pair of transistors connected as a differential pair to have a low input impedance, a current source connected into the input stage to bias the first pair of transistors, and an output taken from at least one of the transistors; (b) a photodiode connected into the input stage to have a differential effect upon current flowing through the transistors; and (c) an amplifier stage having an input connected to the output of the input stage;

a high pass filter section coupled to said photodiode amplifier, said filter section having a plurality of frequency responses that are selected to separate signal components due to high efficiency light from signal components due to other types of lighting; and means coupled to said high pass filter section for detecting the presence of signal components due to high efficiency lighting.

2. The illuminant discriminator as claimed in claim 1 wherein said means for detecting the presence of signal components comprises a logic section for receiving the output from the high pass filter section.

3. An illuminant discriminator comprising:

a photodiode amplifier for converting an impinging illuminant into an analog signal, said photodiode amplifier comprising (a) an input stage including a first pair of transistors connected as a differential pair to have a low input impedance, a current source connected into the input stage to bias the first pair of transistors, and an output taken from at least one of the transistors; (b) a photodiode connected into the input stage to have a differential effect upon current flowing through the transistors; and (c) an amplifier stage having an input connected to the output of the input stage;

high pass filter means coupled to said photodiode amplifier and having a first section with a first cutoff characteristic selected to pass signal components due to various types of lighting including high efficiency lighting, and a second section having a second cutoff characteristic selected to separate signal components due to high efficiency lighting from signal components due to other types of said various types of lighting; and means coupled to said high pass filter means for discriminating the type of illuminant from the signal components passed by the respective sections having the respective cutoff characteristics.

4. An illuminant discriminator as claimed in claim 3 wherein said first section of said high pass filter means has a filter response that passes signal components due to tungsten, fluorescent, and high efficiency lighting, and said second section of said high pass filter means has a filter response that passes signal components due to high efficiency lighting and attenuates signal components due to tungsten and fluorescent lighting.

5. An illuminant detector as claimed in claim 4 further including switching means for selectively coupling either said first high pass filter section or said second high pass filter section to said photodiode amplifier.

6. An illuminant detector as claimed in claim 4 wherein said analog signal is sampled and digitized, and wherein said means for discriminating the type of illuminant comprises digital filter means for filtering signal components due to different types of lighting and digital comparator stages for identifying the signal components.

7. An illuminant discriminator comprising:

a photodiode amplifier for converting an impinging illuminant into an analog signal, said photodiode amplifier comprising (a) an input stage including a first pair of transistors connected as a differential pair to have a low input impedance, a current source connected into the input stage to bias the first pair of transistors, and an output taken from at least one of the transistors; (b) a photodiode connected into the input stage to have a differential effect upon current flowing through the transistors; and (c) an amplifier stage having an input connected to the output of the input stage;

a log means coupled to said photodiode amplifier for converting said analog signal into a signal having a DC component and a ratio component;

high pass filter means coupled to said log means, said high pass filter means having a plurality of passbands, including a first passband including frequencies from a variety of artificial illuminants, and a second passband including frequencies from a particular artificial illuminant;

a first and a second filter means each having a filtering frequency corresponding to the harmonic frequencies of an artificial illuminant power source;

first and second comparator stages each having at least two inputs, one of which is coupled to receive the output from said first and said second filter means, respectfully, and the other of which is adapted to receive threshold signals corresponding in level to the level of different types of illuminants for providing outputs indicating the magnitude of the outputs from said first and said second comparing means with respect to the received threshold signals;

a third comparator stage for comparing the output of said first filter means with the output from said second filter means and for providing an output indicating which is greater;

means for setting the output of the high pass filter means to either the first passband or the second passband; and logic means coupled to the outputs of said first, second, and third comparator stages and to said setting means for determining the type of illuminant impinging on said photodetector means from the outputs sensed by said comparing means.

8. The illuminant discriminator as claimed in claim 7 wherein said high pass filter means comprises a high pass filter circuit and first and second switches for switching respective capacitances into the high pass filter circuit whereby one capacitance provides a low frequency cutoff for the first passband and the other capacitance provides a high frequency cutoff for the second passband.

9. The illuminant discriminator as claimed in claim 8 wherein the second passband includes frequencies from a high efficiency illuminant.

10. The illuminant discriminator according to claim 9 wherein the analog signal output by said high pass filter means is digitized, said first and second filter means comprises first and second digital filters and said first and second comparator stages are comprised of a plurality of digital comparator stages each having at least two inputs for receiving on one of its inputs a respective digital output from said digital filters and for receiving on the other inputs digital threshold signals.

11. The illuminant discriminator of claim 10 wherein said third comparator is comprised of:

a digital gain stage having an input connected to the digital output of said first digital filter for providing a multiple gain to the output signal from said first digital filter;

a digital comparator stage means having two inputs one of which is connected to the digital output of said digital gain stage and the other of which is connected to the output of said second digital filter for providing an output indicating which is greater.

12. The illuminant discriminator of claim 11 wherein two of said plurality of digital comparator stages are connected to the output of said first digital filter and four of said plurality of digital comparator stages are connected to the output of said second digital filter.

* * * * *